United States Patent [19]

Marks

[11] Patent Number: 4,972,094
[45] Date of Patent: Nov. 20, 1990

[54] LIGHTING DEVICES WITH QUANTUM ELECTRIC/LIGHT POWER CONVERTERS

[76] Inventor: Alvin M. Marks, Bigelow Rd., Athol, Mass. 01331

[21] Appl. No.: 146,229

[22] Filed: Jan. 20, 1988

[51] Int. Cl.$^5$ .............................. H01L 15/00
[52] U.S. Cl. ................... 307/150; 307/151; 315/158; 315/169.1; 357/12
[58] Field of Search ............... 307/11, 132 R, 41, 38, 307/40, 148, 149, 150; 315/47, 49, 53, 58, 62, 64, 71, 73, 76, 91, 84, 133, 152, 155, 158, 161, 169.1, 169.4, 171, 176, 290, 200 R, 185 R, 185 S, 189, 190, 191, 192, 267, 315, 316, 311, 312, 326; 362/80, 224, 355; 313/498, 499, 491, 512, 500, 511, 582, 497, 579; 360/716, 762, 766, 771, 772, 782, 753, 719; 250/542, 552, 553; 350/345; 357/32, 45, 17; 358/56, 230, 240, 241

[56] References Cited

U.S. PATENT DOCUMENTS

| | | |
|---|---|---|
| 3,737,704 | 6/1973 | Grenon et al. ............... 315/169.1 X |
| 3,933,527 | 1/1976 | Tarneja et al. .................... 437/17 |
| 4,100,427 | 7/1978 | Durand et al. ................. 307/66 X |
| 4,175,249 | 11/1979 | Gruber ............................. 307/66 X |
| 4,211,955 | 7/1980 | Ray ..................................... 315/53 |
| 4,329,625 | 5/1982 | Nishizawa et al. ............... 315/158 |
| 4,346,329 | 8/1982 | Schmidt ......................... 313/498 X |
| 4,445,050 | 4/1984 | Marks ............................ 307/151 X |
| 4,480,212 | 10/1984 | Monahan et al. .......... 315/200 R X |
| 4,482,779 | 11/1984 | Anderson ....................... 357/12 X |
| 4,503,447 | 3/1985 | Iafrate et al. .................... 357/12 X |
| 4,516,057 | 5/1985 | Proud et al. ........................ 315/260 |
| 4,574,161 | 3/1986 | Marks ............................... 357/12 X |
| 4,595,862 | 6/1986 | Morimoto et al. .......... 315/169.1 X |
| 4,630,183 | 12/1986 | Fujita ................................ 313/512 X |
| 4,675,577 | 6/1987 | Hanlet ............................. 336/229 X |
| 4,686,425 | 8/1987 | Havel ............................... 315/158 X |
| 4,688,068 | 8/1987 | Chaffin et al. ................... 357/12 X |
| 4,698,730 | 10/1987 | Sakai et al. .................... 313/499 X |
| 4,720,642 | 1/1988 | Marks ................................... 307/150 |
| 4,725,740 | 2/1988 | Nakata ............................ 307/66 X |
| 4,727,289 | 2/1988 | Uchida ............................ 315/53 X |
| 4,742,291 | 5/1988 | Bobier et al. ..................... 307/66 X |
| 4,755,804 | 7/1988 | Levati et al. ..................... 307/64 X |
| 4,768,738 | 9/1988 | Weinert ............................ 244/53 R |
| 4,780,621 | 10/1988 | Bartleucci et al. .............. 307/38 X |
| 4,794,272 | 12/1988 | Bavaro et al. ................... 307/64 X |
| 4,797,566 | 1/1989 | Nozaki et al. .................... 307/66 X |

*Primary Examiner*—William M. Shoop, Jr.
*Assistant Examiner*—Paul Ip

[57] ABSTRACT

Lighting devices are described in which the light source comprises a plurality of light emitting structures utilizing the direct conversion of electron energy to photon energy, at high efficiency. Structures are described which will emit color or white light. The lighting devices include thin light sources which emit polarized light in a radiation lobe pattern or as a parallel beam of light, useful for ceiling panels for general polarized nonglare lighting, street lighting, polarized automobile nonglare systems, and long life white light electric lighting lightbulbs with screwin sockets for 120v AC, which are self rectifying. A solar powered street lamp system is also described.

21 Claims, 8 Drawing Sheets

SERIES-PARALLEL CONFIGURATION

SERIES-PARALLEL OFFSET CONFIGURATION

LIGHTING DEVICES WITH QUANTUM ELECTRIC/LIGHT POWER CONVERTERS

FIELD OF THE INVENTION

This invention relates to lighting devices with a quantum electric/light power converter supplied by electric power from a conventional source, or by a quantum light/electric power converter; for solar street lamps and other uses; and, a system incorporating such devices with means for the storage and retrieval of the electric power.

CROSS REFERENCE TO RELATED APPLICATIONS

This application is related to: FEMTO DIODE AND APPLICATIONS, Ser. No. 637,405 filed Aug. 3, 1984, issuing as U.S. Pat. No. 4,720,642 on Jan. 19, 1988 [1], which is a continuation in part of: DEVICE FOR THE CONVERSION OF LIGHT POWER TO ELECTRIC POWER, Ser. No. 330,791 filed Dec. 15, 1981, now issued as U.S. Pat. No. 4,445,050 [2]. A method of manufacturing the submicron circuits which may be utilized as a light source herein is described in copending application Ser. No. 001330, filed Jan. 2, 1987, entitled SUPER SUBMICRON ELECTRON BEAM WRITER (SUPERSEBTER TM) [3]. All of the said patents and applications were invented by Alvin M. Marks and are incorporated herein in whole or in part by reference.

BACKGROUND OF THE INVENTION

It is now realized that solar electric power should be used whereever possible to minimize the use of fossil fuels which are in limited supply, to decrease atmospheric pollution, and to decrease capital and operating costs.

I. A conventional sodium-vapor street lamp, which is the most efficient (17.6%) light source may utilize 1000 watts of electric power between sundown and sunup for 10 hours during the night, thus requiring about 10 Kwh of electric energy. A solar panel may be exposed to available ambient sunlight for about 8 hrs a day. If the lamp is located in the north-eastern United States the incident solar power will vary from zero at night to a maximum of about 900 w/m$^2$ in summer; with an average of about 500 w/m$^2$; or 55.5%.

Presently available large area solar panels comprise amorphous silicon semiconductor coatings on stainless steel sheets. [4] These panels are rated at about 45 w/m$^2$ at an efficiency of about 8%. A peak incident power of about 563 w/m$^2$ corresponds to the midday sun in summer at a latitude of 40°. At other times of the day and year, and on overcast days the power output is considerably less. Other factors are cost, presently about $6.00/w retail; and a useful life of 20 years. It is assumed the lamp is "on" to provide illumination from 7 PM to 5 AM at night, or for 10 hours per day; and "off" at other times. The sun is assumed to provide solar power to the panel from 9 AM to 5 PM, or for 8 hours per day. The energy required by a 1000 w lamp is then $E_1 = 10,000$ whrs. The energy produced by the conventional solar-panel is perhaps only about $E_2 = 25$ whrs/m$^2$ for 8 hrs, or 200 whrs/m$^2$. Hence the area of conventional solar panel needed to supply the 1000 w sodium vapor lamp is:

$$A_a = E_1/E_2 = 10,000/200 = 50 \text{ m}^2 \quad (1).$$

The peak rated power from this panel is 45 w/m$^2$. The peak rated electric power output from the 50 m$^2$ of conventional panel is:

$$P = 50 \times 45 = 2250 w = 2.25 \text{ kw} \quad (2).$$

The retail cost of these panels is:

$$C = (\$6./w) \times (2250 \ w) = \$13,500. \quad (3).$$

The rated life is 20 years, producing an average of about 55.5% of peak electric power, or about 1.5 kw electric power for 8 hrs. per day; hence the cost of the panel amortized over 20 years is:

$$c = (\$10,800 \times 100)\cent/(20 \times 365 \times 8 \text{ hrs} \times 1.5 \text{ kw}) = 15.4\cent/\text{kwhr} \quad (4).$$

This is without interest for amortizing the investment, but is a good first approximation. In a few years, the price of photovoltaics is expected to decrease to about $2.00/w, or to 5.1¢per Kwhr, which may be competitive with the cost of power from a conventional electric power source. In a system according to one embodiment of this invention, power generated by a solar panel is connected to a DC/AC solid state inverter and a two-way electric meter to the conventional electric power grid. The meter measures the kwhrs of electric power fed by the solar panel during the day to the grid; and the kwhrs supplied by the grid to the lamp during the night. The electric power Company is charged an agreed price for the energy supplied to the grid; and the electric power Company charges the owner of the System for any power used by the lamp. The costs of the power inputs and outputs may be designed to balance.

II. A solar street lamp illustrates an embodiment of the present invention. Instead of the convention solar panel and lamp above described, a quantum light/electric power converter is used, known as a LEPCON TM Panel. It comprises a plurality of submicron metal-insulator-metal tunnel junctions in metal strips deposited on glass forming arrays of antenna diodes [1]. The device is reversible, and is also employed as quantum electric/light power converter, known as ELCON TM. LEPCON TM or ELCON TM panels may be manufactured by a production device which employs a super submicron electron beam writer, termed a SUPERSEBTER TM [3]. These quantum device never deteriorate because they comprise metals and metal oxide deposited on a glass sheet. However, for comparison with the conventional panel above described, the same life of 20 years is assumed. The light/electric power conversion efficiency of the LEPCON TM panel is about 72%, or 9 times that of the conventional panel. The input solar light power is assumed to be 56% of peak 563 w/m$^2$; or 312 w/m$^2$. The solar energy input available during the sunlight hours of a day per m$^2$ is:

$$E = 8 \times 312 = 2500 \text{ whrs} = 2.5 \text{ kwhrs}/m^2\text{-day} \quad (5).$$

The energy requirement for the ELCON TM lamp to supply the same light output as the sodium vapor 1000 watt lamp for 10 hours at night is:

$$E'_1 = 10 \text{ kwhrs}/(72\%/17.6\%) = 2.5 \text{ kwhrs} \quad (6).$$

The area of LEPCON ™ panel required to supply this electric energy during 8 hours of sun per day is:

$$A_b = (2.5 \text{ kwhrs/sun-day})/(2.5 \text{ kwhrs/sun day}-m^2) = 1.0 \ m^2 \qquad (7).$$

that is, a LEPCON ™ panel of about $3' \times 3''$ is required to power this ELCON ™ lamp.

Comparing the area $A_a$ from (1) of a conventional solar panel supplying a 1000 watt sodium vapor lamp, with the area $A_b$ of a LEPCON ™ panel supplying an ELCON ™ panel having the same light output, from (7), the area ratio is:

$$A_a/A_b = 50/1.0 = 50 \qquad (8).$$

The retail selling price of the LEPCON ™ panel is expected to be \$500./m². The cost of 1 m² Lepcon ™ panel is then:

$$C = 1 \times \$500. = \$500. \qquad (9).$$

Electric energy produced by the LEPCON ™ panel amortized over 20 years costs about:

$$c = (500. \times 100)/(20 \times 365 \times 8 \times 1.0) = 0.86¢/\text{kwhr} \qquad (9).$$

III. Alternatively, the light/electric power may be produced by a thin polymeric sheet known as LUMELOID ™ [5]. It may have about the same efficiency, 72%, as the LEPCON ™ panel. However, its life may be only one-half year. If the LUMELOID ™ sheet provides 1.1 kwhrs solar/electric energy to an ELCON ™ lamp, the area of the LUMELOID ™ sheet is the same as in (6), 1.0 m². The LUMELOID ™ sheet is expected to see at retail for about \$15./m².

The cost of 1. m² of LUMELOID ™ sheet is:

$$c = (1 \ m^2) \times (\$15. \times 100¢/m^2) = 1500¢, (\$15.) \qquad (10).$$

The cost in ¢/Kwhr, amortized over ½ year life is:
$$C = 1500¢/(\tfrac{1}{2} \times 365 \times 8 \times 1.\text{kwhr}) = 1.0¢/\text{kwhr} \qquad (11).$$

Table I Compares the efficiencies of various light sources with a lamp of the present invention:

TABLE 1

| 100% efficiency = 680 lumens/watt at 556 nm. [4] | | | |
|---|---|---|---|
| Type of Lamp | Lumens | Watts | Efficiency |
| Incandescent | 870 | 60 | 2.1% |
| Sodium Vapor | 120,000 | 1000 | 17.6% |
| Quantum Electric/Light | 120,000 | 200 | 72.% |

OBJECTS OF THE INVENTION

It is an object of this invention to provide a thin, compact, efficient, low cost, "cold" light source.

It is an object of this invention to provide as such light source a quantum electric/light power converter.

It is an object of this invention to provide a quantum electric/light power converter in a laser configuration, which emits a parallel beam of polarized light.

It is an object of this invention to provide a laser quantum electric/light source in a polarized headlight system for non glare purposes.

It is an object of this invention to provide such light source in a street lamp.

It is an object of this invention to provide a system comprising a combination of a quantum solar light/electric power panel, a quantum electric/light source and electric power storage means to store electric energy during the day and utilize it at night.

It is an object of this invention to provide a lighting device comprising a quantum electric/light laser source.

It is an object of this invention to provide a plurality of quantum electric/light laser sources in a luminous ceiling panel configuration to provide a field of radially polarized light for general nonglare illumination.

It is an object of this invention to provide a long-life lamp bulb utilizing a quantum electric/light source, which may be powered from the 120 v AC circuit.

These and other systems and devices relating to this invention will become apparent from the specification herein.

DESCRIPTION OF THE INVENTION

Figure 1:
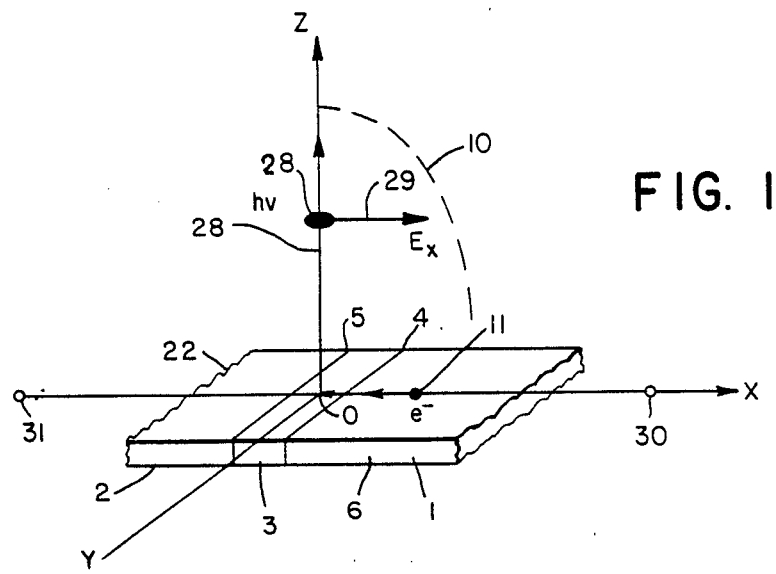
FIG. 1 shows a diagram of a generallized light-emitting diode.
Figure 2:
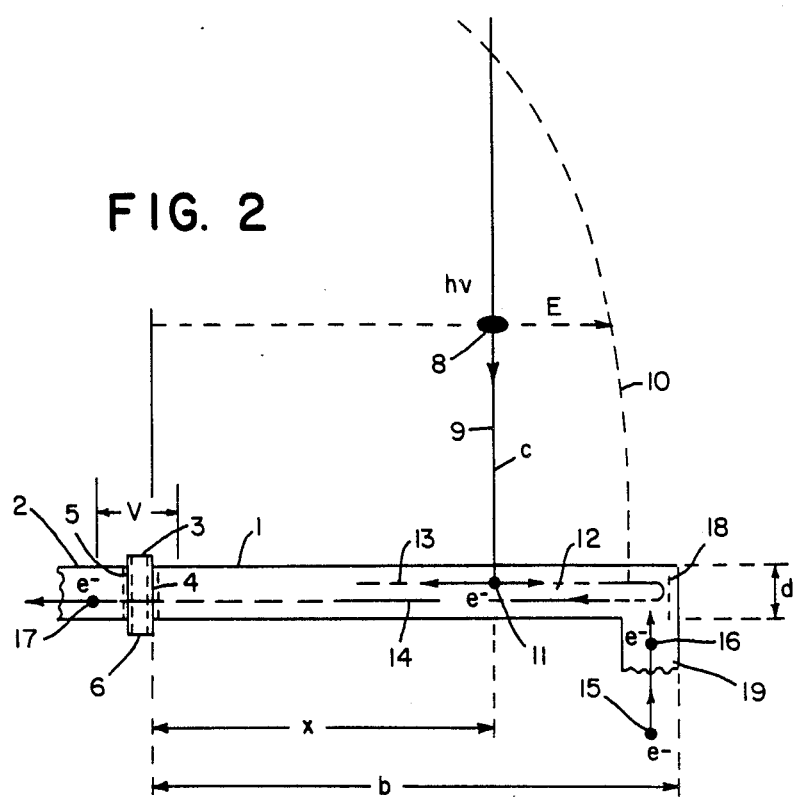
FIG. 2 shows a diagram of a light-emitting diode of this invention to a scale of about 1,000,000/1, comprising an asymmetric metal- insulator- metal tunnel junction in a strip, also known as a Femto Diode.

FIG. 1 shows a fragmentary detail perspective view of an asymmetric metal- insulator- metal tunnel junction 6 such as is shown in FIG. 2. [1] The tunnel junction 6 comprises adjacent faces 4 and 5 on strips 1 and 2, respectively which are separated by the gap 30 which is about 10-35 A wide. Faces 4 and 5 comprise atomic layers with different work functions $\phi_1$ and $\phi_2$ respectively. A voltage V ($1.7 < V < 3$) is applied across the gap between terminals 31 and 32. An electron occasionally tunnels across the gap through the potential difference V. The energy difference $$\xi = eV = hv \quad (12)$$

is directly converted into a light photon of the same energy at the frequency v. This process occurs without loss; in a manner similar to the emission of a light quanta from an atom when an electron jumps from a higher to a lower orbital level through a potential difference. The light quanta or photon 28 is emitted along the OZ axis with its electric vector 29, $E_x$ parallel to the OX long direction of the strips 1 and 2. The combination of strip and tunnel junction is hereinafter termed an "element".

FIG. 2 shows a quantum light/electric power converter, or LEPCON TM previously described [1,2], which may be employed as a solar/electric power converter to provide electric power to the quantum electric/light converters or lamps of this invention, hereinafter described. Alternatively, in lieu of the LEPCON TM panel, there may be employed the sheet polymer LUMELOID TM [5], or a conventional solar/electric power source.

Figure 3:
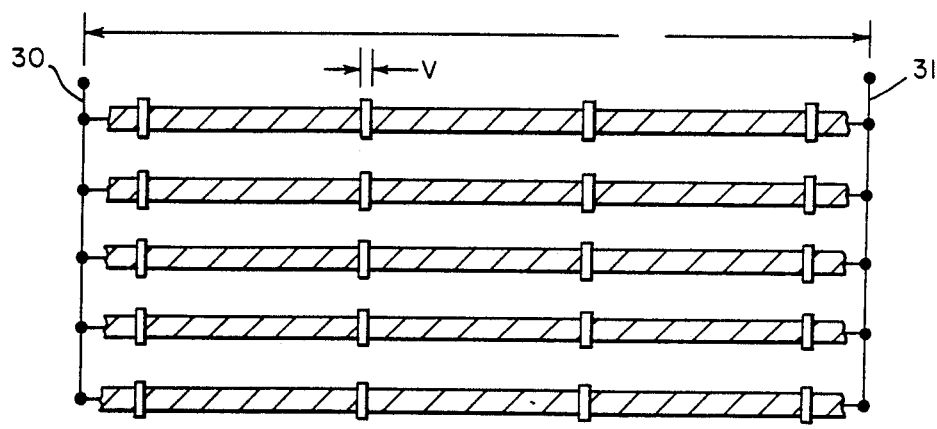
FIG. 3 shows a plan view of array of light -emitting Femto diodes in a series parallel arrangement.

FIG. 3 shows a plan view of a submicron series-parallel circuit of a quantum electric/light converters of this invention.

If a voltage V is applied across each element and there are n elements in series, the total voltage $V_t$ across the busses 30 and 31 is:

$$V_t = nV \quad (13)$$

Figure 4:
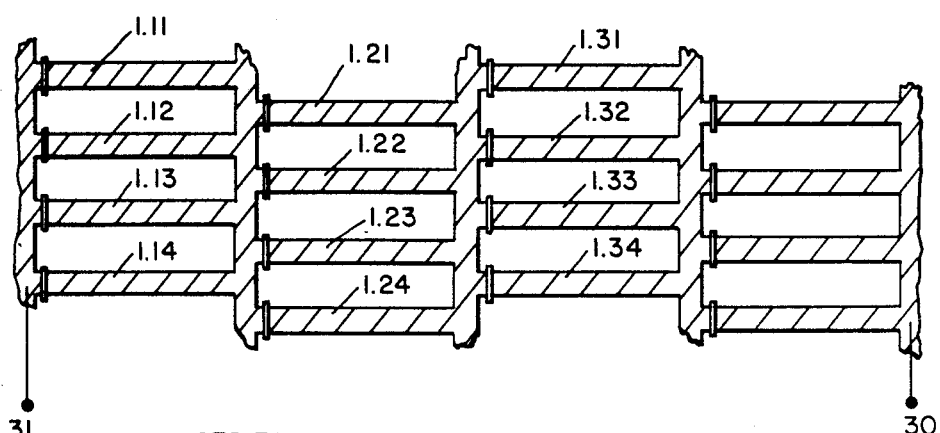
FIG. 4 shows a plan view of array of light -emitting Femto diodes in an series parallel offset arrangement.

A plurality of n metal strips 1.1, 1.2, 1.3, ..1.n and n tunnel diodes 3.1, 3.2, 3.3,...3.n are connected in a "series parallel" configuration. Used as an ELCON TM electric/light converter, a voltage $V_t$ applied across busbars 30 and 31, causes the emission of a light photons. The light photon quantum energy hv equals the energy eV given up by the electron as it drops to the lower potential across 10 to 40 A ($10^{-10}$ m) gap of the tunnel junction. Alternatively this circuit may be employed as a LEPCON TM light/electric converter to provide solar/electric power for any purpose, including electric power to the ELCON TM light source. FIG. 4 is a plan view of a submicron circuit of this invention in which the elements are in a "series parallel offset" configuration.

The parallel elements 1.11, 1.12, .. are offset relative to the adjacent parallel elements. This configuration is similar to FIG. 2, which provides a high natural electric potential barrier 18 at one end of the strip 1. The barrier reflects the high velocity electron 11 back toward the tunnel junction 3 without energy loss. In FIG. 3 the same effect is obtained at one face of the asymmetric tunnel junctions. The wavelength in mµ of a light photon 28 emitted from a junction depends on the voltage V across the junction. To produce white light a mixture of the three primary colors red green and blue is required; the wavelengths being, respectively: 0.65, 0.53 and 0.44 µm, which correspond to the standard color separation filters used in photography (such as the Nos. 21, 58 and 47B manufactured by the Eastman Kodak Co.).

Figure 5:
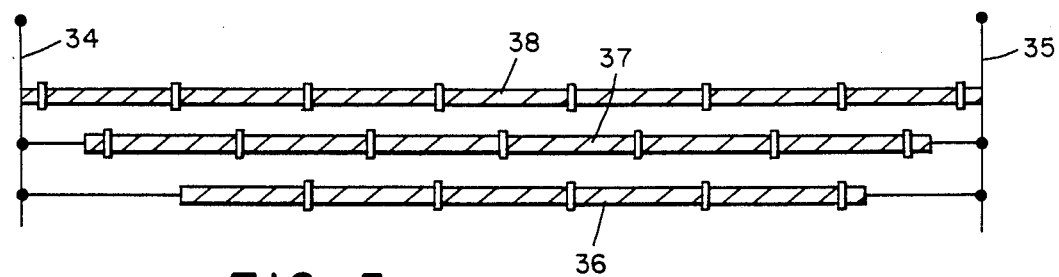
FIG. 5 shows an electrical diagram of light-emitting diodes in a series parallel circuit adapted to produce white light, which are connected to a pair of DC voltage busses.

FIG. 5 is a plan view of a submicron series parallel circuit of elements adapted to produce the three primary colors above sewt forth, which will mix to produce white light.

The equation for wavelength of the photon versus the voltage V is:

$$\lambda = 1.25/V \, \mu m \quad (14)$$

To obtain these 3 standard color wavelengths the corresponding voltages are from (14), respectively: 1.92, 2.36, and 2.84 volts. Each of the three series circuits 36, 37 and 38 have different numbers of elements; for example 5, 6, 7 respectively. If the busbars 34 and 35 have 14 volts DC across them then the voltage across each element is:

| in series line 38: | 14/7 = 2 v | |
| in series line 37: | 14/6 = 2.33 v | (15) |
| in series line 36: | 14/5 = 2.8 v | | which approximates the voltages required to produce the respective colors which mix to produce white light.

Figure 6:
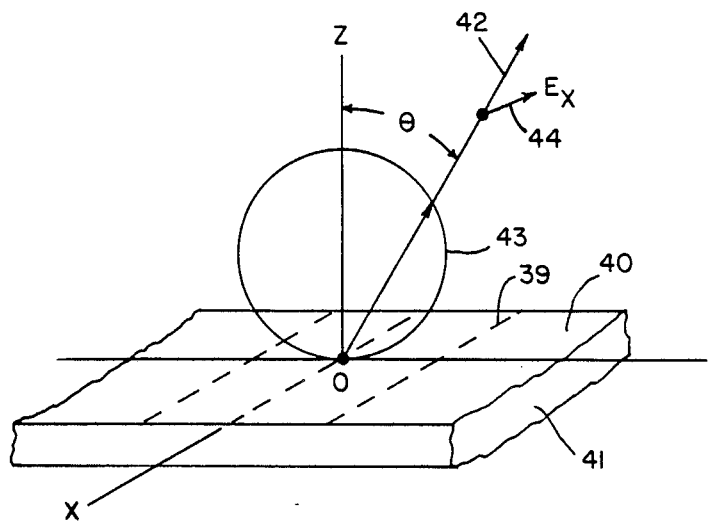
FIG. 6 shows a diagram of an array of light emitting diodes on a surface, showing the radiation lobe pattern of the light emitted.

FIG. 6 is a perspective view of an array of elements 39 on the surface 40 of a substrate sheet 41. The elements 39 are aligned with their long axes parallel to the OX axis in XOY plane 40 of the sheet 41. The intensity of a light ray 42 emitted from this sheet varies with its angle $\theta$ to the OY axis of the sheet, according to the radiation lobe pattern 43. The electric vector 44, $E_x$ of the light ray 42 is parallel to the OX axis.

Figure 7:
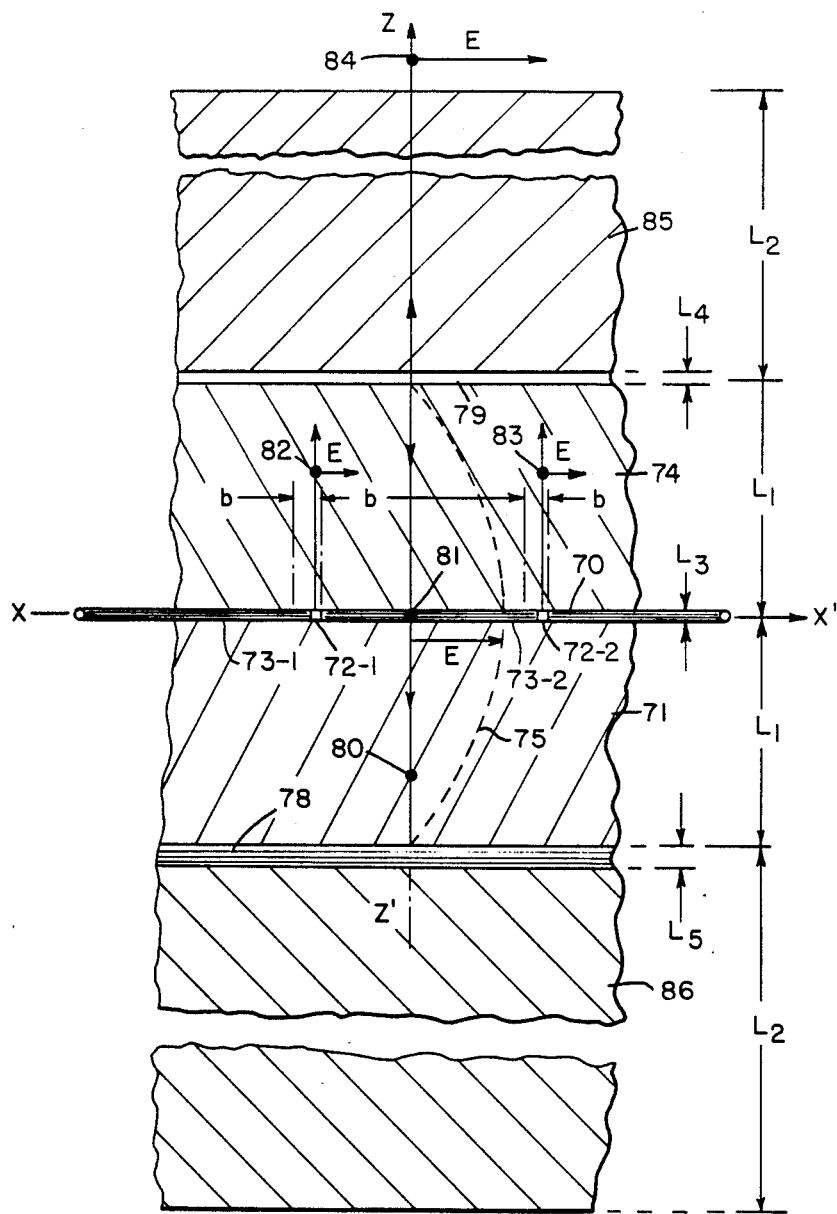
FIG. 7 shows a diagram of an array of light-emitting diodes positioned on a surface within an optical cavity which functions as a large area laser, which emits a parallel beam of polarized light normal to the surface.

FIG. 7 shows a fragmentary cross section of an Elcon TM electric/light power converter operating as a laser, and producing a parallel beam of polarized light. The array of elements is contained between two transparent layers 71 and 74 of thickness $L_1$, each layer having a ¼ wave retardation. A ½ wavelength is shown as curve 75. An optical cavity is formed between the full mirror 78 and the ½ silvered mirror 79. The photons 80 are reflected back and forth coherently between the mirrors, interacting with the array 70, and causing emission of additional photons which eventually escape through the ½ silvered mirror 79 as parallel laser beam 84. Thick sheets 85 and 86 support and protect the structure.

Figure 8:
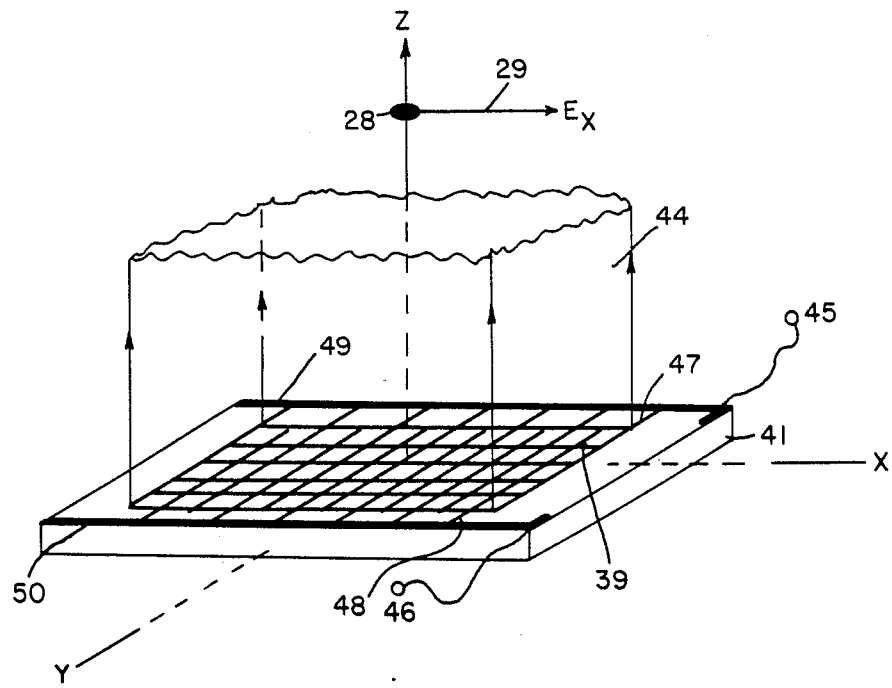
FIG. 8 shows a perspective view of a lighting panel incorporating the light sources of this invention.

FIG. 8 shows a perspective view of a thin compact light source of this invention, which may be the type shown in FIGS. 6 or 7; respectively with a spread-beam 42, or a parallel beam 84, both however producing polarized light. In FIG. 8 the optical configuration shown in FIG. 7 is utilized in thin surface layers (too thin to show in this FIG.) on the substrate sheet 41. Light emitting elements 39 with their long axis parallel to the OX axis are connected between the minor bus bars 47 and 48. The minor bus bars 30 and 31 are connected "to" to the main busbars 49 and 50, and thence to the terminals 45 and 46. A DC voltage is applied to the terminals 45 and 46. Using the configuration shown in FIG. 7 are emitted from the elements 39 in a parallel beam 44 in the OZ direction normal the XOY plane of the sheet. The parallel beam 84 is polarized light with its electric vector 29 parallel to the OX axis.

Figure 9:
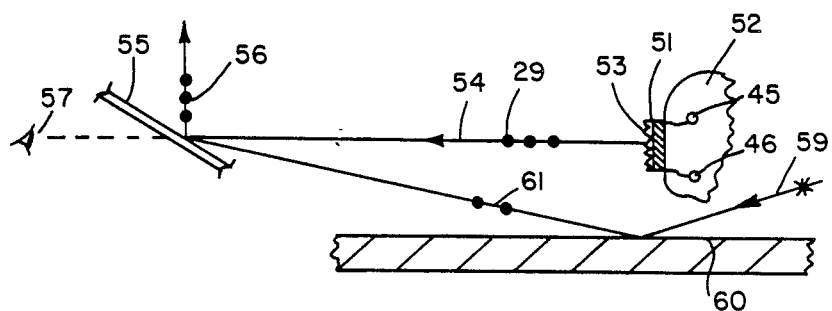
FIG. 9 shows a diagram of the lighting panel of FIG. 7 in a nonglare polarized headlight system for automobiles.

FIG. 9 shows a diagram of a vertical plane of a nonglare polarized headlight system according to this invention. Polarized Headlight Systems are well known in the art [6]. These systems were unacceptable because the standard polarizers transmitted only 35% of the light, or were too large to fit as standard headlight receptacle, and were too expensive.

The lamp of the present invention overcomes these problems by providing a low cost, thin, and efficient polarized light source, such as shown and described in FIG. 8, for use in the system shown in FIG. 9. In FIG. 9 the light source described in FIG. 8 is generally designated 51 and mounted on the autobody 52. A cover plate 53 has a plurality of conventional lenses embossed on its outer surface to provide a suitable auto light beam pattern. The beam 44 is preferably polarized with its electric vector 29 horizontal. In this configuration the polarized light beam 56 is reflected from a multilayer polarizer 55 on the windshield of an approaching car, or absorbed in a conventional sheet polarizer nonglare visor between the windshield and the driver's eye 57. Nonpolarized light 53 reflecting from the road surface 55, is polarized by reflection as a glare beam 54. Both beams 44 and 54 are intercepted and reflected or absorbed before reaching the observer's eye 52; and the observer sees only the transmitted component of vertical electric vector of light reflected from the approaching vehicle or from the road, 60 free of glare.

Figure 10:
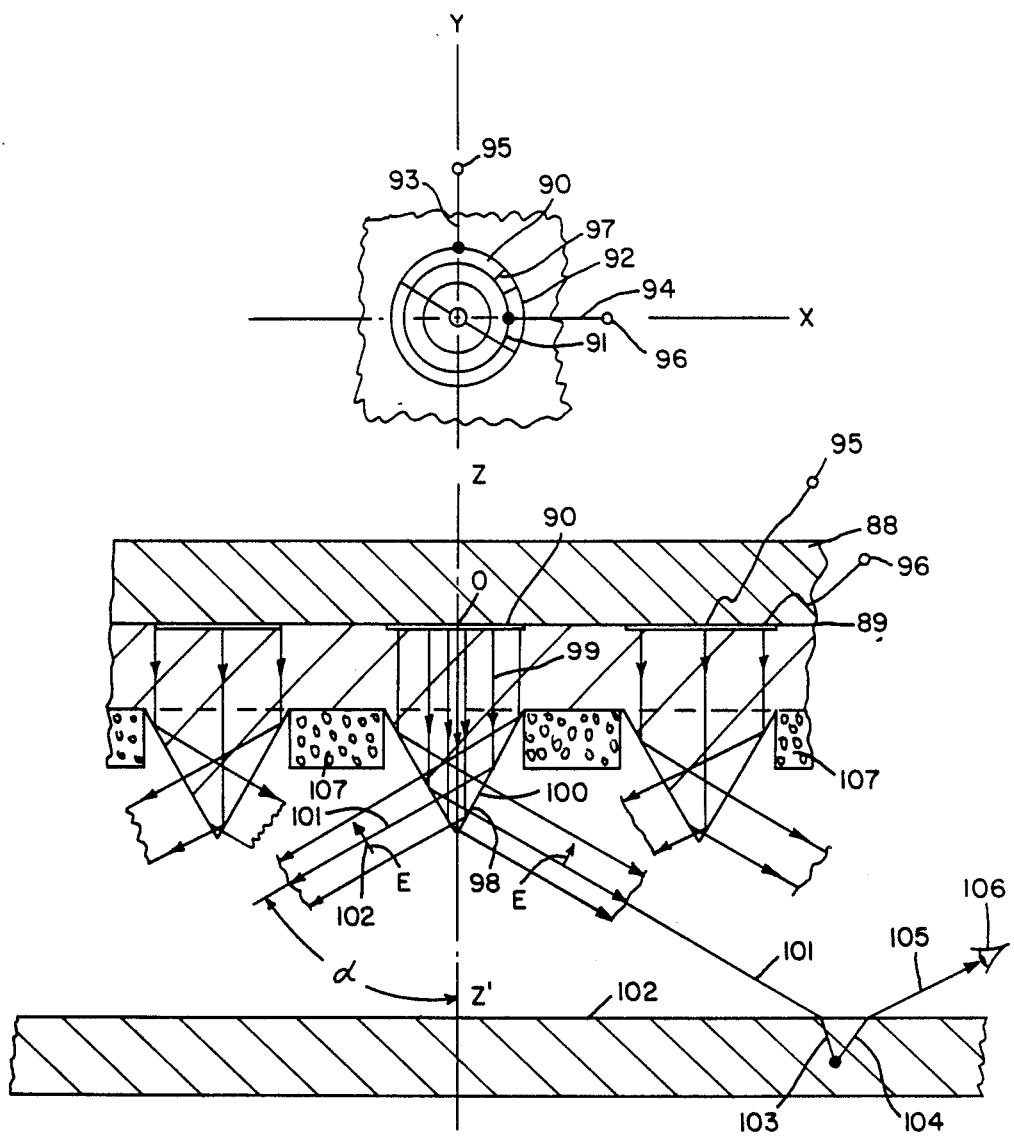
FIG. 10 shows a cross section of the light sources of this invention positioned in ceiling panel structure, providing a field of radially polarized light for the nonglare illumination of a viewing surface.

FIG. 10 shows a ceiling panel adapted to provide a radial field of polarized light for general nonglare illumination as in a system previously described. [7] Notwithstanding the considerable commercial use of prior art polarized ceiling panels, there are presently limitations to their wide spread use because of these deficiencies: the light source is inefficient, the % polarization of the light is usually only about 40%, cost is high, and the nonglare property not fully utilized. The present invention overcomes these deficiencies in the prior art polarized ceiling panels.

Referring to FIG. 10 there is shown a section of a polarized ceiling panel of this invention; and above a fragmentary plan view of the radial emitter module 90. Module 90 comprises a plurality of concentric minor busbars 91.

Light emitting elements 92 are disposed radially connected between successive concentric minor busbars. The concentric minor busbars are connected to radially disposed major busbars 93 and 94; and thence to the terminals 95 and 96. The module 90 comprising the thin layer laser structure 89 shown in FIG. 7, which is too thin to show in the FIG. Parallel light beam 99 is emitted along the vertical OZ axis. The surface 100 of a transparent cone 98 has an apex angle of approximately 60°, reflecting the parallel beam 99 by total internal reflection, into a conically dispersed beam 101 at an angle about 60° to the OZ vertical axis. Every ray 102 is polarized with its electric vector in the plane of incidence. When such a ray 101 is incident of on a transparent horizontal viewing surface 102, it is totally refracted into the surface and the surface gloss is absent. The light ray 105 reaching an observer's eye 106, is from below the surface 102, and shows high contrast; that is is nonglare light. The modules 90 are spaced on the surface of the supporting sheet 88. Optionally, the spaces between the modules can be provided with a perforated sound absorbing sheet 107.

Figure 11:
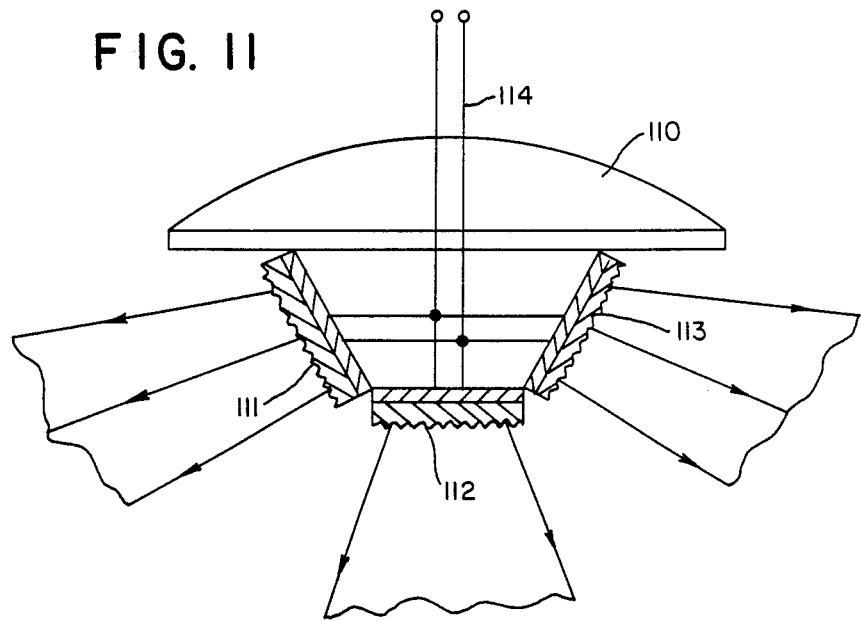
FIG. 11 shows a cross section of the lighting panel of FIG. 8 in a street lamp for road illumination.

FIG. 11 shows a street lamp 110 employing the light-emitting sheets 111, 112, 113 previously described herein. The sheets are disposed to provide the required light pattern. Electric power is supplied via the leads 114 to the panels. The advantage in using these sheets in a street lamp are apparent from the above disclosure.

Figure 12:
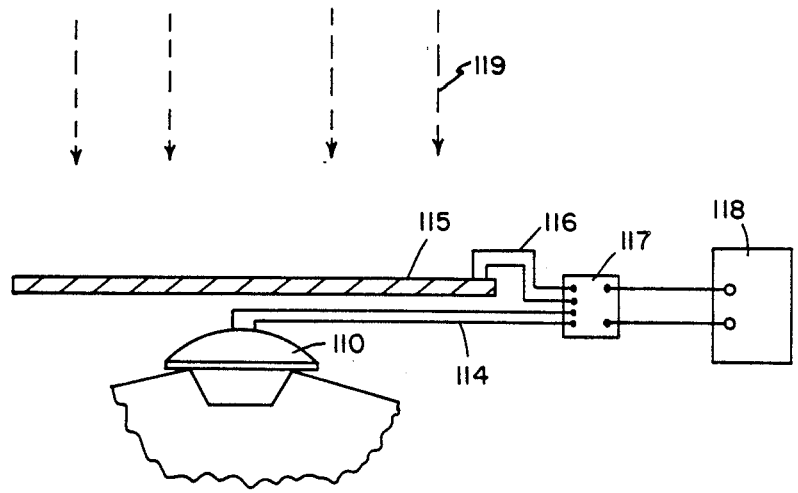
FIG. 12 shows a diagram of the street lamp of FIG. 10 in an electrical system powered at night from an electric power supply which is replenished during the day by electric power from a solar/electric power converter.

FIG. 12 shows a diagram of the street lamp 110 of FIG. 11, which may be powered via leads 114. The system may employing a solar power source 115 powered by sunlight 119. The solar electric power source is preferably the light/electric power converter known as LEPCON TM previously described, or any other photovoltaic source. The solar electric power is suplied via leads 116, which are connected to an electronic control device 117, to which are also connected the street lamp 110 via lead 114, and an electric storage device 118. such as a battery, or the electric grid.

Figure 13:
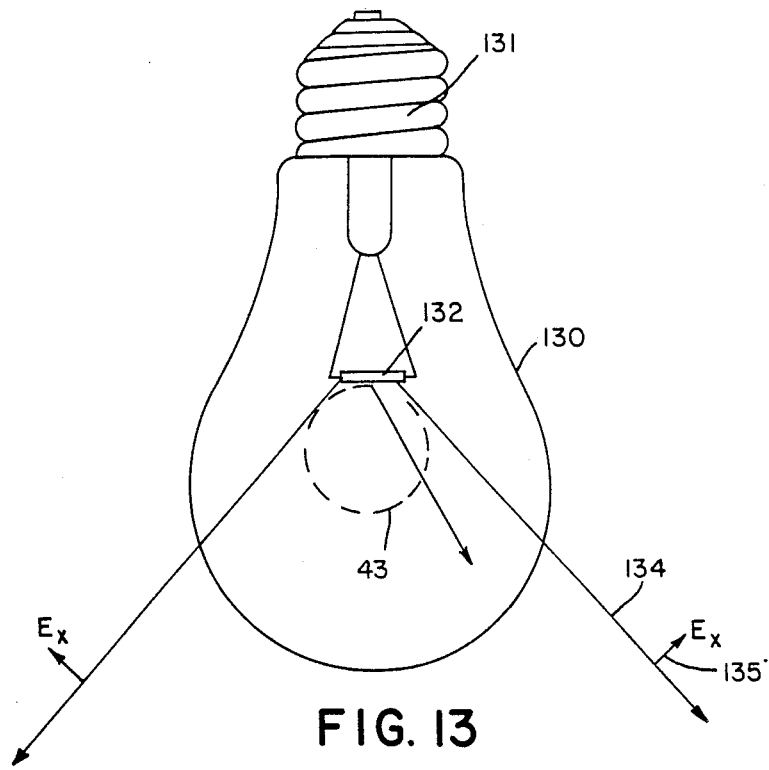
FIG. 13 shows a cross sectional view of a long-life electric light bulb with a standard socket employing the light source of FIG. 6.
Figure 14:
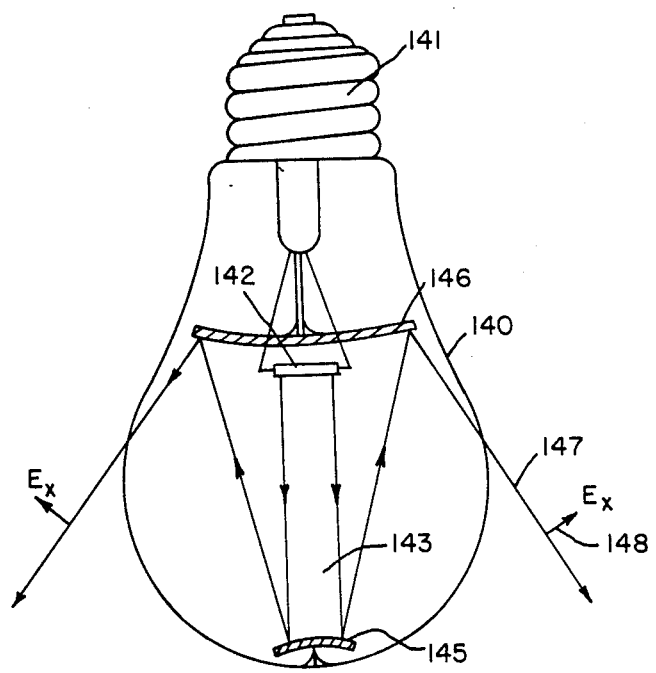
FIG. 14 shows a cross sectional view of a long-life electric light bulb with a standard socket employing the light source of FIG. 7.

FIGS. 13 and 14 show light bulbs 130 and 140 according to this invention which are generally similar in outward appearance to the conventional incandescent light bulb. The bulbs have conventional screwin electrical connectors 131 and 141, and light emitting sheets 132 and 142 according to this invention. In FIG. 13, the light emitting sheet 132 provides the spreadbeam radiation pattern 43 described in connection with FIG. 6. In FIG. 14, the light emitter 142 produces the parallel light beam 143 as disclosed in connection with FIG. 7. The beam 142 may be spread by reflectors 145 and 146, finally emerging as rays 147, which are polarized with the electric vector 148.

Since the bulb of FIG. 13 does not require the reflectors, is simpler in construction, and costs less, it is preferable.

An advantage of the light bulb of this invention may be understood by the comparison with the light emitted from a 100 watt incandescent bulb (2% efficient) with the light emitted from the light bulb of FIG. 13 (70% efficient). The latter will deliver the same light as the former, but with a power input of only 100 (2/70)=3 watts approximately.

There may be incorporated in the bulb a rectifier, $\frac{1}{2}$ or full wave, to provide DC electric power to the elements. However, the light emitting elements are inherent diodes. About 50 of them may be connected directly to the 120 v AC line, where they will function as $\frac{1}{2}$ wave rectifiers; they may be connected in a full wave configuration without requiring an external rectifier. The variation of AC voltage will cause the elements to emit at various frequencies, thus producing a white light average emission.

Various modifications of the disclosure herein may be made without departing from the scope of this invention.

REFERENCES

[1] FEMTO DIODE AND APPLICATIONS (LEPCON TM and Elcon TM), U.S. Pat. No. 4,720,642, issued Jan. 19, 1988 to Alvin M. Marks,
[2] DEVICE FOR THE CONVERSION OF LIGHT POWER TO ELECTRIC POWER (LEPCON TM), U.S. Pat. No. 4,445,050, issued Apr. 24, 1984 to Alvin M. Marks,
[3] SUPER SUBMICRON ELECTRON BEAM WRITER (SUPERSEBTER TM), U.S. Pat. No. 4,798,959, issued Jan. 17, 1989 to Alvin M. Marks,
[4] R-100 Photovoltaic Module (Amorphous), 6–9% light/electric power conversion efficiency, Data from back of Brochure Form 8601, 1986 Sovonics Solar Systems, a subsidiary of Energy Conversion Devices, Inc. 1100 West Maple Road, Troy, MI 48084,
[5] ORDERED DIPOLAR LIGHT-ELECTRIC POWER CONVERTER (LUMELOID TM), U.S. Pat. No. 4,574,161, issued Mar. 4, 1986 to Alvin M. Marks,

[6] LIGHT POLARIZING DEVICE, U.S. Pat. No. 3,026,763, issued Mar. 27, 1962 to Alvin M. Marks, a CIP of:
GLARE ELIMINATING OPTICAL SYSTEM, U.S. Pat. No. 2,887,566, issued May 19, 1959 to Alvin M. Marks,

[7] MULTI-LAYERED LIGHT POLARIZERS, U.S. Pat. No. 3,069,974, issued Dec. 25, 1962 to Alvin M. Marks, Having fully described this invention what I wish to claim is:

1. A quantum electric/light source comprising an insulating sheet, a surface on said sheet, a quantum electric/light converter structure, a plurality of said structures supported on said surface in a thin sheet-like planar light-emitter array, electron means in said structure, said structures being connected in a circuit, terminals on said surface, conducting busses on said surface connected to said terminals, said circuit being connected to said busses, an external source of electric energy connected to said terminals, said source applying a voltage drop across said structure to supply energy to said electron, means the energy of said electron means being converted to photon energy emitted as light from said surface.

2. A quantum electric/light source according to claim 1, in which said light-emitting structures are connected in a series/parallel configuration.

3. A quantum electric/light source according to claim 1 in which said light emitting structure comprises an asymmetric metal-insulator-metal tunnel junction in a metal strip.

4. A quantum electric/light source according to claim 3, in which said light-emitting structures are connected in a series/parallel/offset configuration.

5. A quantum electric/light source according to claim 1, in which said light-emitting structures are connected in a series/parallel configuration, the said structures in series being adjacent parallel lines having having respectively n=a, b, c structures, a structures in the first line, b structures in the second line and c structures in the third line, the same potential being applied across each of said series lines, a different voltage being thereby applied across the structures in each of the first, second and third lines, said emissions being merged, whereby white light is emitted from said surface.

6. A quantum electric/light source according to claim 1, in which said electric energy source supplies alternating current and voltage, said light emitting structures being connected across said source, the sinusidal variation of said voltage causing a periodic variation in the wavelength of the light emitted from said structures, whereby white light is emitted by the said device.

7. A quantum electric/light source according to claim 1, in which said light is emitted from said structures in a radiation pattern in a plane normal to said surface, said emitted light being polarized.

8. A quantum electric/light source according to claim 1, comprising a planar laser system, a first component of said system further comprising a light reflecting layer on said surface, a first transparent layer on said reflecting layer, a second component of said system further comprising said planar array of said light emitting structures on said first transparent layer, a second transparent layer layer on said planar array, and a third component of said system further comprising a semi-transparent reflecting layer on said second transparent layer, said first and second transparent layers each having a thickness $t_o = \lambda/4n$, where $\lambda$ is the wavelength of the said photon, $\lambda$ and $t_o$ being in Angstroms, and where n is the index of refraction of each of said transparent layers, the system of the said first, second and third components constituting a planar optical cavity on said sheet whereby the emission of coherent light is stimulated and emitted as a parallel laser beam normal to the said surface.

9. A quantum electric/light source according to claim 1 positioned in a lighting device, said source supplying light to said device.

10. A quantum electric/light source according to claim 9, in which said lighting devise comprising a module, said module comprises a plurality of said structures in lines on said surface, said lines being positioned radially about an axis normal to said surface, busses concentric about said axis, said structures in said lines being connected in series between said busses, a transparent material, said material having the configuration of a cone with its axis coinciding with the normal axis, whereby light emitted normal to said surface is totally internally reflected from the inside of said cone, and distributed radially downward at an angle of about 60° to said axis, thereby providing a field of nonglare polarized illumination.

11. A quantum electric/light source according to claim 10, in which said lighting devise comprises a horizontally positioned ceiling panel, a plurality of said modules positioned in spaced relationship on said panel adapted to provide a radial distribution of polarized light rays downward about a normal to said panel, said rays being polarized with their electric vector in the plane of incidence of said rays onto a horizontal viewing surface, whereby the said rays are refracted into said viewing surface, gloss reflection therefrom being decreased, and viewing contrast increased.

12. A quantum electric/light source according to claim 10 in which said comprise a polarized ceiling panel, lighting device sound absorbing material, said sound absorbing material being located between said spaced modules.

13. A quantum electric/light source according to claim 9 in which said lighting device comprise a streetlamp, a plurality of said sheet-like planar light emitting arrays, said sheets being positioned in said street-lamp respectively horizontally and at an angle to the horizontal, said sheets providing a predetermined pattern of polarized light in a forward and downward direction.

14. A quantum electric/light source according to claim 9, in which said light system comprises a light/electric power converter, an electric power means for storing or supplying electric power, an electric circuit, an electronic control device in said electric circuit, whereby said means supplies electric power to said lighting device during the dark hours of the day, and whereby said converter supplies electric power and stores it in said means during the sunny hours of the day.

15. A quantum electric/light source according to claim 14, in which said ligthing system comprises differential recording watthour meter in said electric control circuit, whereby the difference in the flow of electric energy to and from said means is recorded.

16. A quantum electric/light source according to claim 14, in which said light/electric power converter is a photovoltaic light electric power converter.

17. A quantum electric/light source according to claim 14, in which said light/electric power converter comprises a quantum light/electric power converter.

18. A quantum electric/light source according to claim 14, in which said means is the electric supply grid or a storage battery.

19. A quantum electric/light source according to claim 7, further comprising a light transmitting envelope, said light emitter being located on a small area near the center of said envelope, a socket attached to said envelope, said electric power source being connected to said socket to provide power to said light source, said light being projected out of said envelope in a light distribution pattern.

20. A quantum electric/light source according to claim 1, further comprising a light transmitting envelope, said light source being located on a small area near the center of said envelope, said source emitting a parallel laser beam of light, a source of electric power, a socket attached to said envelope, said socket being adapted to attach to said electric power source, said emitter being connected to said socket, an optical means located within said envelope for gathering and spreading the said beam toward said envelope, whereby the said light is transmitted through said envelope in a light distribution pattern.

21. A quantum electric/light source according to claim 9, in which said lighting device further comprising an envelope surrounding said device, said envelope being light-diffusing.

* * * * *